(12) United States Patent
Lee

(10) Patent No.: US 9,741,971 B2
(45) Date of Patent: Aug. 22, 2017

(54) FLEXIBLE DISPLAY DEVICE AND METHOD OF MANUFACTURING THE SAME

(71) Applicant: Samsung Display Co., Ltd., Yongin, Gyeonggi-do (KR)

(72) Inventor: Dae-Geun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 348 days.

(21) Appl. No.: 14/463,620

(22) Filed: Aug. 19, 2014

(65) Prior Publication Data

US 2015/0163911 A1  Jun. 11, 2015

(30) Foreign Application Priority Data

Dec. 10, 2013  (KR) .................. 10-2013-0153263

(51) Int. Cl.
```
B29C 65/52    (2006.01)
B32B 37/12    (2006.01)
B32B 37/26    (2006.01)
B32B 38/10    (2006.01)
C09J 5/02     (2006.01)
H01L 51/56    (2006.01)
H01L 51/00    (2006.01)
H01L 27/32    (2006.01)
```
(52) U.S. Cl.
CPC .......... *H01L 51/56* (2013.01); *H01L 51/003* (2013.01); *H01L 51/0097* (2013.01); *B32B 2457/20* (2013.01); *H01L 27/3244* (2013.01);
*Y02E 10/549* (2013.01); *Y02P 70/521* (2015.11); *Y10T 29/49128* (2015.01)

(58) Field of Classification Search
USPC ......... 156/247, 249, 289, 305, 307.3, 307.7, 156/308.2, 309.9, 701, 711, 712
See application file for complete search history.

(56) References Cited

U.S. PATENT DOCUMENTS 5,541,748 A * 7/1996 Ono .................... H01L 27/1214
349/138
5,739,887 A * 4/1998 Ueda ................. G02F 1/133604
349/149

(Continued)

FOREIGN PATENT DOCUMENTS

JP         2003-124256 A    4/2003
KR   10-2001-0039786 A     5/2001

(Continued)

*Primary Examiner* — Sing P Chan
(74) *Attorney, Agent, or Firm* — Lewis Roca Rothgerber Christie LLP

(57) ABSTRACT

A method for manufacturing a flexible display device by forming a flexible base substrate on a carrier substrate, the flexible base substrate having a display region and a non-display region, forming a display unit comprising a plurality of pixels at the display region, separating the flexible base substrate from the carrier substrate, forming an adhesive layer under the flexible base substrate, forming a flexible carrier film under the adhesive layer, forming a pressed region of the adhesive layer by partially pressing the adhesive layer, and mounting a driving circuit at a portion of the non-display region overlapping the pressed region.

11 Claims, 6 Drawing Sheets

(56) References Cited

U.S. PATENT DOCUMENTS

| | | | | |
|---|---|---|---|---|
| 5,838,400 A * | 11/1998 | Ueda | G02F 1/133604 | 349/58 |
| 6,191,838 B1 * | 2/2001 | Muramatsu | H01R 12/7076 | 349/149 |
| 6,675,470 B2 * | 1/2004 | Muramatsu | H01R 12/7076 | 29/830 |
| 6,693,384 B1 * | 2/2004 | Vicentini | G02F 1/13452 | 257/668 |
| 6,876,143 B2 * | 4/2005 | Daniels | H01L 27/14627 | 257/E27.15 |
| 7,256,427 B2 * | 8/2007 | Daniels | H01L 27/14627 | 257/40 |
| 7,378,124 B2 * | 5/2008 | Daniels | B08B 1/04 | 427/487 |
| 7,489,382 B2 * | 2/2009 | Chen | G02F 1/13452 | 349/152 |
| 7,566,633 B2 * | 7/2009 | Koyama | H01L 27/1214 | 257/59 |
| 7,785,938 B2 * | 8/2010 | Yamaguchi | H01L 21/8221 | 257/E23.016 |
| 7,799,369 B2 * | 9/2010 | Daniels | B82Y 20/00 | 427/256 |
| 7,906,784 B2 * | 3/2011 | Koyama | H01L 27/1214 | 257/368 |
| 7,977,170 B2 * | 7/2011 | Tredwell | H01L 29/78603 | 438/151 |
| 8,012,288 B2 * | 9/2011 | Kim | G02F 1/133305 | 156/235 |
| 8,022,405 B2 * | 9/2011 | Yamazaki | H01L 27/12 | 257/57 |
| 8,067,802 B2 * | 11/2011 | Dekker | H01L 27/12 | 257/347 |
| 8,120,159 B2 * | 2/2012 | Yamaguchi | H01L 21/8221 | 257/686 |
| 8,288,214 B2 * | 10/2012 | Tredwell | H01L 29/78603 | 438/151 |
| 8,288,856 B2 * | 10/2012 | Yamaguchi | H01L 21/8221 | 257/686 |
| 8,471,995 B2 * | 6/2013 | Tseng | G02F 1/133305 | 349/145 |
| 8,530,253 B2 * | 9/2013 | Shin | H01L 51/003 | 257/E33.06 |
| 8,680,528 B2 * | 3/2014 | Yamazaki | H01L 27/12 | 257/57 |
| 8,754,332 B2 * | 6/2014 | Sumida | G02F 1/13452 | 174/254 |
| 8,796,051 B2 * | 8/2014 | Choi | H01L 24/75 | 438/26 |
| 8,836,909 B2 * | 9/2014 | Kubota | G02F 1/137 | 349/168 |
| 9,167,697 B2 * | 10/2015 | Kim | H05K 3/323 | |
| 9,276,047 B2 * | 3/2016 | Ko | H01L 27/3223 | |
| 9,318,475 B2 * | 4/2016 | Bibl | G09F 9/301 | |
| 9,341,873 B2 * | 5/2016 | Chen | G02F 1/133305 | |
| 9,356,256 B2 * | 5/2016 | Choi | H01L 51/0097 | |
| 9,419,065 B2 * | 8/2016 | Degner | H01L 27/326 | |
| 9,450,197 B2 * | 9/2016 | Min | H01L 51/0097 | |
| 2001/0000763 A1 * | 5/2001 | Muramatsu | H05K 3/365 | 439/74 |
| 2002/0029857 A1 | 3/2002 | Yamada | | |
| 2003/0048256 A1 * | 3/2003 | Salmon | G06F 1/1613 | 345/168 |
| 2004/0097005 A1 * | 5/2004 | Daniels | H01L 27/14627 | 438/99 |
| 2004/0113543 A1 * | 6/2004 | Daniels | H01L 27/14627 | 313/504 |
| 2004/0252113 A1 * | 12/2004 | Vicentini | G02F 1/13452 | 345/205 |
| 2005/0025881 A1 * | 2/2005 | Daniels | H01L 27/14627 | 427/66 |
| 2005/0088079 A1 * | 4/2005 | Daniels | B08B 1/04 | 313/504 |
| 2006/0186512 A1 * | 8/2006 | Dekker | H01L 27/12 | 257/635 |
| 2006/0202206 A1 * | 9/2006 | Koyama | H01L 27/1214 | 257/67 |
| 2007/0014916 A1 * | 1/2007 | Daniels | B82Y 20/00 | 427/66 |
| 2007/0254455 A1 * | 11/2007 | Yamaguchi | H01L 21/8221 | 438/455 |
| 2007/0273820 A1 * | 11/2007 | Chen | G02F 1/13452 | 349/150 |
| 2007/0285903 A1 * | 12/2007 | Tomari | G02F 1/13452 | 361/748 |
| 2008/0090338 A1 * | 4/2008 | Tredwell | H01L 29/78603 | 438/151 |
| 2008/0158498 A1 * | 7/2008 | Chang | G02F 1/133305 | 349/158 |
| 2008/0248191 A1 * | 10/2008 | Daniels | B82Y 20/00 | 427/66 |
| 2009/0020759 A1 * | 1/2009 | Yamazaki | H01L 27/12 | 257/59 |
| 2009/0047859 A1 * | 2/2009 | Kim | G02F 1/133305 | 445/24 |
| 2009/0194771 A1 * | 8/2009 | Koyama | H01L 27/1214 | 257/72 |
| 2009/0304909 A1 * | 12/2009 | Daniels | H01L 27/14627 | 427/66 |
| 2010/0002404 A1 * | 1/2010 | Fujita | H05K 1/0271 | 361/752 |
| 2010/0171138 A1 * | 7/2010 | Yamazaki | H01L 27/3246 | 257/98 |
| 2010/0244250 A1 * | 9/2010 | Yamaguchi | H01L 21/8221 | 257/741 |
| 2011/0139493 A1 * | 6/2011 | Sumida | G02F 1/13452 | 174/254 |
| 2011/0212555 A1 * | 9/2011 | Tredwell | H01L 29/78603 | 438/27 |
| 2011/0220610 A1 * | 9/2011 | Tredwell | H01L 29/78603 | 216/13 |
| 2011/0278577 A1 * | 11/2011 | Yamazaki | H01L 27/12 | 257/59 |
| 2012/0038032 A1 * | 2/2012 | Dekker | H01L 27/12 | 257/623 |
| 2012/0061841 A1 * | 3/2012 | Yamaguchi | H01L 21/8221 | 257/761 |
| 2012/0062447 A1 * | 3/2012 | Tseng | G02F 1/133305 | 345/33 |
| 2012/0107978 A1 * | 5/2012 | Shin | H01L 51/5253 | 438/29 |
| 2012/0133881 A1 * | 5/2012 | Kubota | G02F 1/137 | 349/191 |
| 2012/0228617 A1 * | 9/2012 | Ko | H01L 51/0097 | 257/59 |
| 2012/0280229 A1 * | 11/2012 | Suzuki | H01L 27/0688 | 257/43 |
| 2012/0286264 A1 * | 11/2012 | Suzuki | H01L 27/1225 | 257/43 |
| 2014/0042406 A1 * | 2/2014 | Degner | H01L 27/326 | 257/40 |
| 2014/0106484 A1 * | 4/2014 | Choi | H01L 24/75 | 438/26 |
| 2014/0140029 A1 * | 5/2014 | Kim | H05K 3/323 | 361/783 |
| 2014/0160695 A1 * | 6/2014 | Jeong | H05K 3/305 | 361/749 |
| 2014/0234664 A1 * | 8/2014 | Yasumoto | H01L 21/6836 | 428/698 |
| 2014/0356559 A1 * | 12/2014 | Khachatryan | B32B 17/06 | 428/34.4 |
| 2014/0361980 A1 * | 12/2014 | Iwaki | G06F 3/14 | 345/156 |
| 2015/0004306 A1 * | 1/2015 | Cho | G02F 1/133351 | 427/58 |
| 2015/0034935 A1 * | 2/2015 | Choi | H01L 51/0097 | 257/40 |
| 2015/0050758 A1 * | 2/2015 | Ko | H01L 27/3223 | 438/23 |

(56) References Cited

U.S. PATENT DOCUMENTS

| | | | |
|---|---|---|---|
| 2015/0069345 A1* | 3/2015 | Beom | H01L 51/0024 257/40 |
| 2015/0069403 A1* | 3/2015 | Suzuki | H01L 27/1218 257/72 |
| 2015/0130777 A1* | 5/2015 | Park | G09G 3/2085 345/206 |
| 2015/0195915 A1* | 7/2015 | Namkung | B32B 37/26 361/750 |
| 2015/0333221 A1* | 11/2015 | Bibl | G09F 9/301 257/88 |
| 2015/0379923 A1* | 12/2015 | Lee | G09G 3/3233 345/206 |
| 2016/0035801 A1* | 2/2016 | Kim | H01L 27/3244 257/40 |
| 2016/0041428 A1* | 2/2016 | Hirakata | G02F 1/1334 345/212 |
| 2016/0042696 A1* | 2/2016 | Hirakata | G02F 1/1334 345/207 |
| 2016/0042702 A1* | 2/2016 | Hirakata | H01L 27/1225 345/205 |
| 2016/0043153 A1* | 2/2016 | Min | H01L 51/0097 257/40 |
| 2016/0380232 A1* | 12/2016 | Yi | H01L 51/5253 257/40 |

FOREIGN PATENT DOCUMENTS

| | | |
|---|---|---|
| KR | 10-2009-0062063 A | 6/2009 |
| KR | 10-2013-0024097 A | 3/2013 |

* cited by examiner

FLEXIBLE DISPLAY DEVICE AND METHOD OF MANUFACTURING THE SAME

CROSS-REFERENCE TO RELATED APPLICATION

This application claims priority to and the benefit of Korean Patent Application No. 10-2013-0153263, filed on Dec. 10, 2013 in the Korean Intellectual Property Office (KIPO), the contents of which are incorporated herein in its entirety by reference.

BACKGROUND

1. Field

Example embodiments of the present invention relate generally to a display device, and a method of manufacturing the flexible display device.

2. Description of the Related Art

An organic light emitting diode (OLED) element may include an organic layer between an anode and a cathode. Positive holes from the anode may be combined with electrons from the cathode in the organic layer between the anode and the cathode to emit light. The OLED element may have a variety of advantages, such as a wide viewing angle, a rapid response speed, relatively thin thickness, and low power consumption.

A flexible display device is manufactured using the OLED elements. A driving circuit of the flexible display device may be mounted by a chip-on-film (COF) technique, or by a chip-on-plastic (COP) technique. In the COF technique, the driving circuit is mounted on a film, and the film couples a flexible panel to a flexible printed circuit board (FPCB). In the COP technique, the driving circuit is directly mounted on a plastic substrate using anisotropic conductive film (ACF). However, when the driving circuit is mounted using the COF technique, a size of the flexible display device may increase. In addition, when the driving circuit is mounted using the COP technique, a contact failure between the driving circuit and the plastic substrate may occur.

SUMMARY

Some example embodiments are provided that describe a flexible display device capable of preventing a contact failure of a driving circuit.

Some example embodiments are provided that describe a method of manufacturing a flexible display device.

According to an aspect of example embodiments, a method of manufacturing a flexible display device may include forming a flexible base substrate on a carrier substrate, the flexible base substrate having a display region and a non-display region, forming a display unit comprising a plurality of pixels at the display region, separating the flexible base substrate from the carrier substrate, forming an adhesive layer under the flexible base substrate, forming a flexible carrier film under the adhesive layer, forming a pressed region of the adhesive layer by partially pressing the adhesive layer, and mounting a driving circuit at a portion of the non-display region overlapping the pressed region.

The pressed region may have a thickness in a range of about 0.1 μm to about 3 μm.

The forming the pressed region may include pressing the adhesive layer using a pressing tool.

The pressing the adhesive layer may include heating the pressing tool before pressing the adhesive layer.

The pressed region may have a rectangular shape.

The pressed region may have a rectangular shape with rounded or chamfering corners.

The flexible base substrate may include a polyimide (PI).

The adhesive layer may include at least one of a rubber-based resin, an acrylic-based resin, a vinyl ester-based resin, a silicon-based resin, or a urethane-based resin.

The flexible carrier film may include includes a polyethylene terephthalate (PET).

The mounting the driving circuit may include using an anisotropic conductive film (ACF).

The forming the pressed region may further include pressing the ACF at the non-display region.

According to another aspect of example embodiments, a flexible display device may include a flexible carrier film, an adhesive layer on the flexible carrier film, the adhesive layer having a non-pressed region and a pressed region, wherein a height of the pressed region is smaller than a height of the non-pressed region, a flexible base substrate on the adhesive layer, the flexible base substrate having a display region and a non-display region, a display unit comprising a plurality of pixels, at the display region, and a driving circuit at the non-display region overlapping the pressed region, the driving circuit configured to provide a data signal to the display unit.

The flexible carrier film may include a polyethylene terephthalate (PET).

The adhesive layer may include at least one of a rubber-based resin, an acrylic-based resin, a vinyl ester-based resin, a silicon-based resin, or a urethane-based resin.

The pressed region may have a thickness of about 0.1 μm to about 3 μm.

The difference between the height of the pressed region and the height of the non-pressed region may be about 20 μm to about 50 μm.

The pressed region may have a rectangular shape.

The pressed region may have a rectangular shape with rounded or chamfering corners.

The flexible base substrate may include a polyimide (PI).

The driving circuit may be coupled to the non-display region with an anisotropic conductive film (ACF).

Therefore, a flexible display device according to example embodiments of the present invention may prevent a contact failure of a driving circuit, and may improve visibility of a pressed mark to check whether the driving circuit is correctly mounted.

In addition, a method of manufacturing the flexible display device according to example embodiments of the present invention may reduce a size of the flexible display device, and may reduce manufacturing cost of the flexible display device.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Example embodiments of the present invention will be described more fully hereinafter with reference to the accompanying drawings, in which various embodiments are shown.

Figure 1:
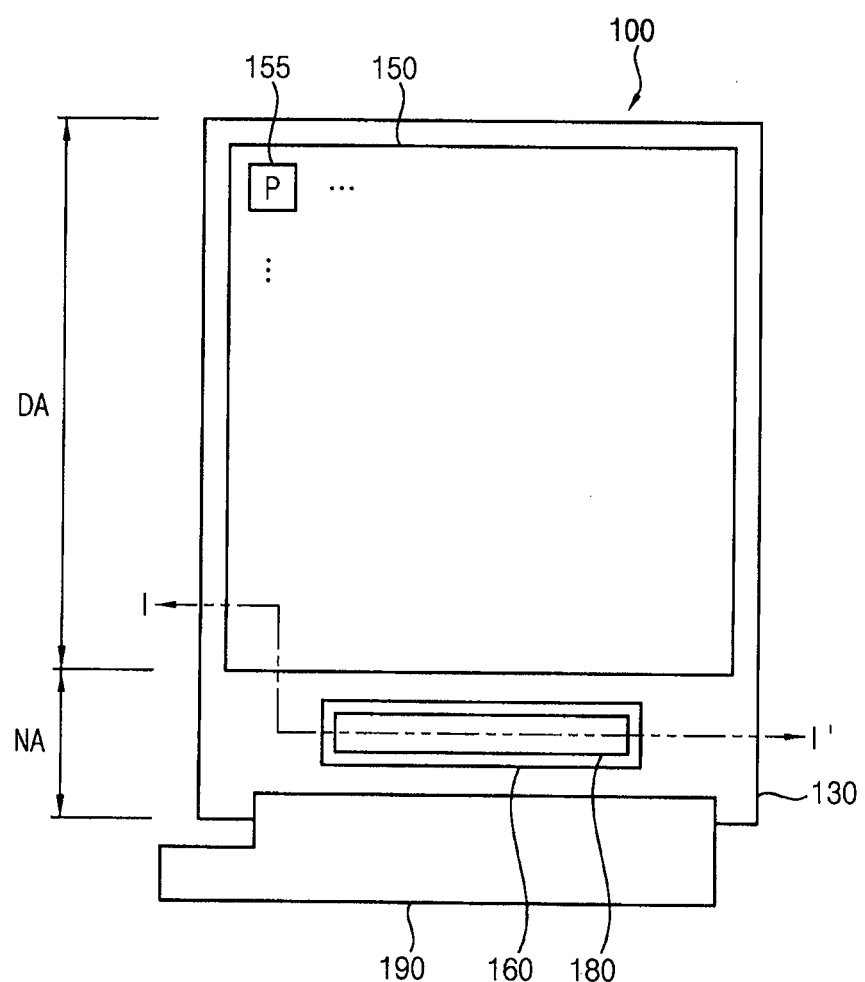
FIG. 1 is a plan view illustrating a flexible display device according to example embodiments of the present invention.
Figure 2:
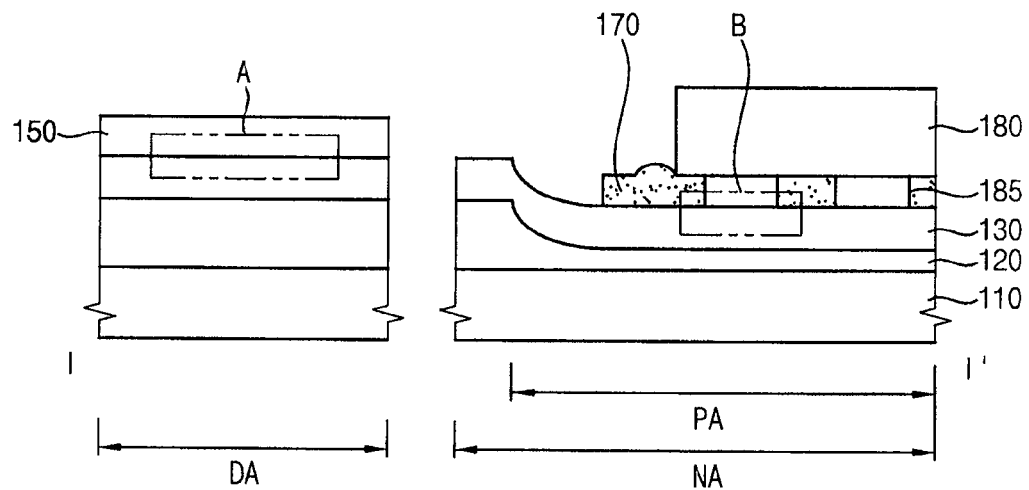
FIG. 2 is a cross-sectional view of a portion of the flexible display device taken along the line I-I' of FIG. 1.

FIG. 1 is a plan view illustrating a flexible display device according to example embodiments of the present invention. FIG. 2 is a cross-sectional view of a portion of the flexible display device taken along the line I-I' of FIG. 1.

According to an embodiment illustrated in FIGS. 1 and 2, the flexible display device 100 includes a flexible carrier film 110, an adhesive layer 120, a flexible base substrate 130, a display unit 150, and a driving circuit 180.

The flexible carrier film 110 may sustain the flexible base substrate 130, such that the flexible carrier film 110 is under (or on) the flexible base substrate 130. The flexible carrier film 110 may include a material that can be bent or curved. According to an example embodiment, the flexible carrier film 110 may be a polyethylene terephthalate (PET).

The adhesive layer 120 may be on the flexible carrier film 110. Thus, the adhesive layer 120 may be located between the flexible carrier film 110 and the flexible base substrate 130. The flexible base substrate 130 may adhere to, or may be coupled to, the flexible carrier film 110 by the adhesive layer 120. According to an example embodiment, the adhesive layer 120 may be at least one of a rubber-based resin, an acrylic-based resin, a vinyl ester-based resin, a silicon-based resin, and a urethane-based resin.

The adhesive layer 120 may have a non-pressed region (e.g., a region of the adhesive layer 120 that is not compressed) and a pressed region PA (e.g. a pressed area, or a region of the adhesive layer 120 that is compressed). According to the present embodiment, a height, or thickness, of the pressed region PA is smaller than a height, or thickness, of the non-pressed region. Thus, the pressed region PA of the adhesive layer 120 may have a step difference. In the present embodiment, the pressed region PA is a region in which the adhesive layer 120 is pressed (or compressed) by pressure.

According to an example embodiment, the pressed region PA is formed at the adhesive layer 120 by partially pressing the adhesive layer 120. According to an example embodiment, the pressed region PA is formed by pressing the adhesive layer 120 using a pressing tool. The pressing tool may press a portion of non-display region NA that overlaps the adhesive layer 120 to thereby form the pressed region PA. The pressed region PA of the adhesive layer 120 may have a relatively thin thickness and flat surface. Therefore, the driving circuit 180 may be stably mounted on the non-display region NA that overlaps the pressed region PA.

If the adhesive layer 120 does not have the pressed region PA, when the driving circuit 180 is mounted, the flexible base substrate 130 can deform unevenly because the adhesive layer 120 is pushed by pressure when the driving circuit 180 is mounted. In this case, a bonding gap between the flexible base substrate 130 and a bump 185 of the driving circuit 180 may be broadened. In addition, the bump 185 may crack due to an increase in the pressure applied to the edge of the bump 185.

On the other hand, as shown in FIG. 2, and according to the present embodiment, when the adhesive layer 120 has the pressed region PA, and when the driving circuit 180 is mounted on the non-display region NA that overlaps the pressed region PA, the adhesive layer 120 is prevented from being further pushed, or from being undesirably deformed, because the pressed region PA of the adhesive layer 120 already has a relatively thin thickness and flat surface due to already being pressed/compressed. Therefore, the flexible display device 100 may reduce the bonding gap between the flexible base substrate 130 and the bump 185 of the driving circuit 180. Further, the flexible display device 100 does not have a crack in the bump 185, thereby preventing the contact failure of the driving circuit 180. In addition, the flexible display device 100 may improve a visibility of a pressed mark that is generated by mounting the driving circuit 180, because the pressed region PA of the adhesive layer 120 has a relatively thin thickness, and because the bonding gap between the flexible base substrate 130 and the bump 185 of the driving circuit 180 is small. Therefore, it is relatively easy to check whether or not the driving circuit 180 is mounted correctly.

According to an example embodiment of the present invention, the thickness of the pressed region PA is in a range from about 0.1 µm to about 3 µm. According to an example embodiment, a difference between the height of the pressed region PA and the height of the non-pressed region PA is in a range from about 20 µm to about 50 µm. A size of the pressed region PA may be larger than a size of the driving circuit 180, and may have various shapes and sizes. According to an example embodiment, the pressed region PA may have a rectangular shape. That is, the pressed region PA may have a rectangular shape because the driving circuit 180 may have a rectangular shape. According to another example embodiment, the pressed region PA has a rectangular shape with rounded corners, or with chamfering corners. That is, the pressed region PA may have the rounded corners or the chamfering corners to improve the flatness (or flattening) of the adhesive layer 120 when the pressed region PA is formed.

According to an embodiment of the present invention, the flexible base substrate 130 is on the adhesive layer 120, and includes a display region (e.g., display area) DA and the non-display region (e.g., non-display area) NA. The display unit 150, which includes a plurality of pixels 155, may be formed on the display region DA. The driving circuit 180 may be mounted at a portion of the non-display region NA that overlaps the pressed region PA. The flexible base substrate 130 may include an insulation material. According to an example embodiment, the flexible base substrate 130 may include a polyimide (PI). The flexible base substrate 130 may include the PI to improve mechanical strength and heat resistance. Therefore, the flexible display device 100 may have the flexible base substrate 130 including the PI, thereby improving durability.

The display unit 150 may be on the display region DA. The pixels 155 included in the display unit 150 may be electrically coupled to the driving circuit 180 on the non-display region NA through signal lines. In addition, the display unit 150 may display images by receiving data signals from the driving circuit 180. According to an example embodiment, the display unit 150 includes an organic light emitting diode (OLED) element.

The driving circuit 180 may provide the data signals to the pixels 155. The driving circuit 180 may be mounted at a portion of the non-display region NA that overlaps the pressed region PA. Therefore, the driving circuit 180 may be stably mounted by preventing the adhesive layer 120 from being pushed. The driving circuit 180 may be directly mounted on the non-display region NA of the flexible base substrate 130 without intermediate structures by a chip-on-plastic (COP) technique. The COP technique does not utilize the film that is used in a chip-on-film (COF) technique. Therefore, the flexible display device 100, according to the embodiments of the present invention, may reduce manufacturing costs and may reduce the size of the flexible display device 100 by directly mounting the driving circuit 180 on the flexible base substrate 130.

According to an example embodiment, the driving circuit 180 may be mounted at the non-display region NA of the flexible base substrate 130 using an anisotropic conductive film (ACF) 170. The ACF 170 may be at an area of the flexible base substrate 130 that overlaps the pressed region PA. The driving circuit 180 may be on a portion of the ACF 170. The ACF 170 may include a conductive particle for making electrical connection, and an adhesive resin for making physical connection.

The bump 185 of the driving circuit 180 may be electrically and physically connected to a contact pad (e.g., see contact pad 240 in FIG. 4) by the ACF 170. Here, the contact pad may be on the flexible base substrate 130, and may be electrically coupled to the pixels. According to an example embodiment, the ACF 170 is formed at a portion of the flexible base substrate 130 that overlaps the adhesive layer 120 in which the pressed region PA is already formed. According to another example embodiment, the pressed region PA is formed when the ACF is pressed on the non-display region NA. If the ACF and the pressed region PA are formed simultaneously, the ACF can have a relatively thin thickness. In some example embodiments, the flexible display device 100 further includes a flexible printed circuit (FPC) that can provide external signals to the driving circuit 180.

Figure 3:
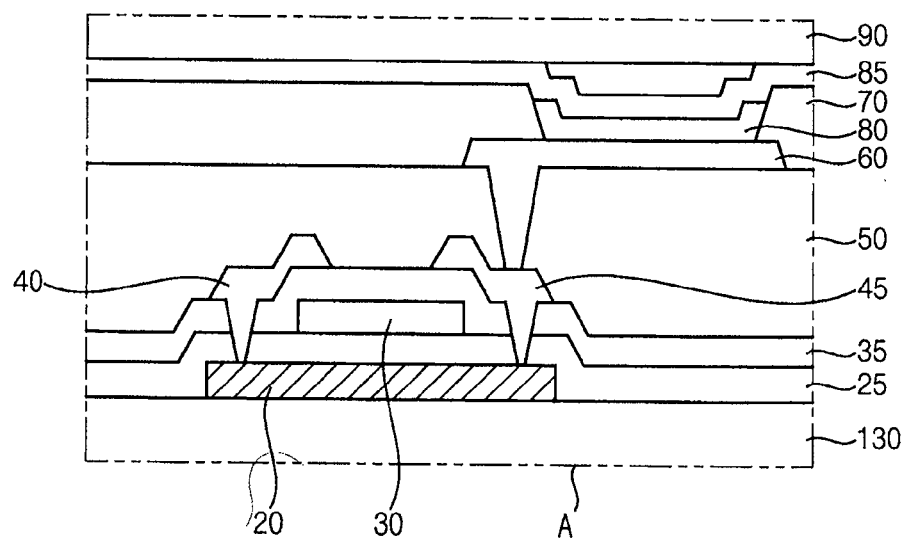
FIG. 3 is an enlarged view illustrating an example of a portion 'A' of FIG. 2.

FIG. 3 is an enlarged view illustrating an example of a portion 'A' of FIG. 2.

Referring to FIG. 3, a display unit may include an OLED element. For example, the display unit may include flexible base substrate 130, a silicon pattern 20, a metal pattern, a display element, and an encapsulating substrate 90. The metal pattern may include a gate electrode 30, a source electrode 40, and a drain electrode 45. A gate insulation layer 25 and an inorganic insulation layer 35 may be on the silicon pattern 20. An organic insulation layer 50 may be on the metal pattern. The display element may be on the organic insulation layer 50. The display element may include a first electrode 60, an intermediate layer 80, and a second electrode 85. Here, each of the respective pixels may be defined (or divided) by a pixel defining pattern 70.

In some embodiments, the silicon pattern 20 includes poly-silicon. The poly-silicon may be formed by a dehydrogenation process of amorphous silicon and by a subsequent crystallization process. For example, during the dehydrogenation process and the crystallization process, the poly-silicon may be formed by a low temperature poly-silicon (LTPS) process using a temperature of about 300 degrees Celsius or higher.

In some embodiments, the gate insulation layer 25 is on the silicon pattern 20, and may entirely cover the silicon pattern 20. In an example embodiment, the gate insulation layer 25 includes silicon oxide, silicon nitride, etc.

In some embodiments, the gate electrode 30 is on the gate insulation layer 25 and overlaps the silicon pattern 20. For example, the gate electrode 30 may overlap a center portion of the silicon pattern 20. In an example embodiment, the gate electrode GE includes aluminum (Al), chromium (Cr), nickel (Ni), molybdenum (Mo), tungsten (W), magnesium (Mg), or their alloys, etc. The gate electrode 30 may also have a single-layered or multiple-layered structure.

In some embodiments, the inorganic insulation layer 35 is on the gate electrode 30 and entirely covers the gate electrode 30. In an example embodiment, the inorganic layer 35 includes silicon oxide, silicon nitride, etc.

In some embodiments, the source electrode 40 is electrically coupled to the silicon pattern 20 through a first contact hole that is formed in the gate insulation layer 25 and in the inorganic insulation layer 35. For example, the source electrode 40 may be coupled to a first end portion of the silicon pattern 20. The source electrode 40 may partially overlap a first end portion of the gate electrode 30.

In some embodiments, the drain electrode 45 is electrically coupled to the silicon pattern 20 through a second contact hole that is formed in both of the gate insulation layer 25 and the inorganic insulation layer 35. For example, the drain electrode 45 may be coupled to a second end portion of the silicon pattern 20 (e.g., a second end portion opposite the abovementioned first end portion of the silicon pattern 20). The drain electrode 45 may partially overlap a second end portion of the gate electrode 30.

In some embodiments, the organic insulation layer 50 is on the inorganic insulation layer 35, on which the source electrode 40 and the drain electrode 45 are formed. For example, the organic insulation layer 50 may have a substantially flat surface.

In some embodiments, the first electrode 60 is on the organic insulation layer 50. The first electrode 60 may be electrically coupled to the drain electrode 45. The first electrode 60 may be a transparent electrode. For example, the first electrode 60 may include indium zinc oxide (IZO), indium tin oxide (ITO), zinc oxide (ZnOx), tin oxide (SnOx), etc. In an example embodiment, the first electrode 60 is used as an anode that provides positive holes (e.g., positively charged holes).

In some embodiments, the pixel defining pattern 70 is on the organic insulation layer 50, on which the first electrode 60 is formed. The pixel defining pattern 70 may partially overlap two end portions of the first electrode 60.

In some embodiments, the intermediate layer 80 is on the first electrode 60. The intermediate layer 80 may sequentially include a hole injection layer (HIL), a hole transfer layer (HTL), an emission layer (EML), an electron transfer layer (ETL) and an electron injection layer (EIL). The first electrode 60 provides positive holes (or electron holes) to the HIL and the HTL. The second electrode 85 provides electrons to the ETL and the EIL. The positive holes are combined with the electrons in the EML to generate light having a desired wavelength. For example, the display element may include light emitting materials that generate red light, green light, blue light, etc. Alternatively, the display element may include a plurality of light emitting materials, each having a different wavelength, or may include a mixture (or combination) of these light emitting materials.

In some embodiments, the second electrode 85 is on the intermediate layer 80. The second electrode 85 may overlap the pixel defining pattern 70. The second electrode 85 may include substantially the same material as that of the first electrode 60. For example, the second electrode 85 may include indium zinc oxide (IZO), indium tin oxide (ITO), zinc oxide (ZnOx), tin oxide (SnOx), etc. In an example embodiment, the second electrode 85 is used as a cathode that provides electrons.

In some embodiments, the encapsulating substrate 90 faces the flexible base substrate 130 to encapsulate the display element. The encapsulating substrate 90 may include an insulation material, and may have substantially the same material as that of the flexible base substrate 130. For example, the encapsulating substrate 90 may include polyimide (PI).

Although it is illustrated in FIG. 3 that a thin film transistor included in the flexible display device has a top-gate structure, the structure of the thin film transistor included in the flexible display device according to example embodiments is not limited thereto. For example, the thin film transistor included in the flexible display device may have a bottom-gate structure.

Figure 4:
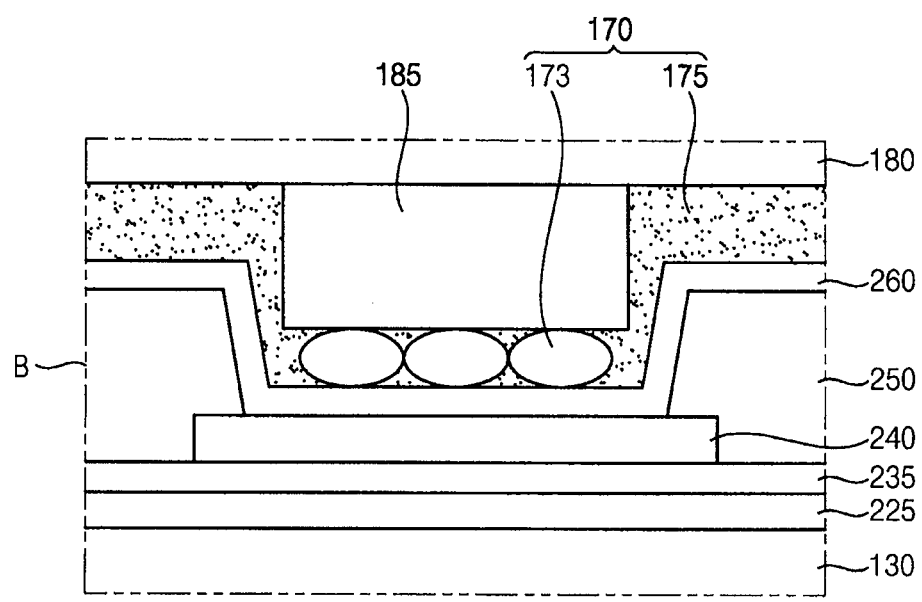
FIG. 4 is an enlarged view illustrating an example of a portion 'B' of FIG. 2.

FIG. 4 is an enlarged view illustrating an example of a portion 'B' of FIG. 2.

Referring to FIG. 4, a driving circuit 180 may include a bump 185. The driving circuit 180 may be electrically coupled to a contact pad 240, which is on the flexible base substrate 130, through the ACF 170. The ACF 170 may include a conductive particle for electrical coupling, and an adhesive resin for physical coupling. The ACF 170 may be located between the flexible base substrate 130 and the bump 185 of the driving circuit 180. The ACF 170 may electrically and physically couple the driving circuit 180 to the contact pad 240.

According to an example embodiment, a contact unit that couples the driving circuit 180 to the flexible base substrate 130 includes a first insulation layer 225, a second insulation layer 235, the contact pad 240, a third insulation layer 250, and a contact assistance unit 260. The first insulation layer 225 may be on the flexible base substrate 130 and may include substantially the same material as that of the gate insulation layer 25. The second insulation layer 235 may be on the first insulation layer 225, and may include substantially the same material as that of the inorganic insulation layer 35. The contact pad 240 may be on the second insulation layer 235, and may be electrically coupled to the source electrode 40 of the display unit. The third insulation layer 250 may be on the second insulation layer 235 and may have a contact hole. The third insulation layer 250 may include substantially the same material as that of the organic insulation layer 50. The contact assistance unit 260 may be disposed on the third insulation layer 250, and may be coupled to the contact pad 240 through the contact hole.

Although it is illustrated in FIG. 4 that a contact unit (that couples the driving circuit 180 to the flexible base substrate 130) has insulation layers included in the display unit, and the contact pad 240 is electrically coupled to the source electrode 40, the contact pad according to the example embodiments is not limited thereto. For example, insulation layers having various structures can be located between the contact pad 240 and the flexible base substrate 130. Alternatively, the contact pad 240 may be directly on the flexible base substrate 130. Also, the contact unit may not include the contact assistance unit, so the contact pad 240 may directly contact the bump 185 of the driving circuit 180 using the ACF 170.

FIGS. 5A through 5G are cross-sectional views illustrating a method of manufacturing a flexible display device according to example embodiments.

Referring to FIGS. 5A through 5G, the method of manufacturing a flexible display device according to the example embodiments includes an operation of forming a flexible base substrate 130 having a display region DA and a non-display region NA on a carrier substrate 10, an operation of forming a display unit 150 including a plurality of pixels at the display region DA, an operation of separating the flexible base substrate 130 from the carrier substrate 10, an operation of forming an adhesive layer 120 under the flexible base substrate 130, an operation of forming a flexible carrier film 110 under the adhesive layer 120, an operation of forming a pressed region PA of the adhesive layer 120 by partially pressing the adhesive layer 120, and an operation of mounting a driving circuit 180 at the non-display region NA that overlaps the pressed region PA.

Figure 5A:
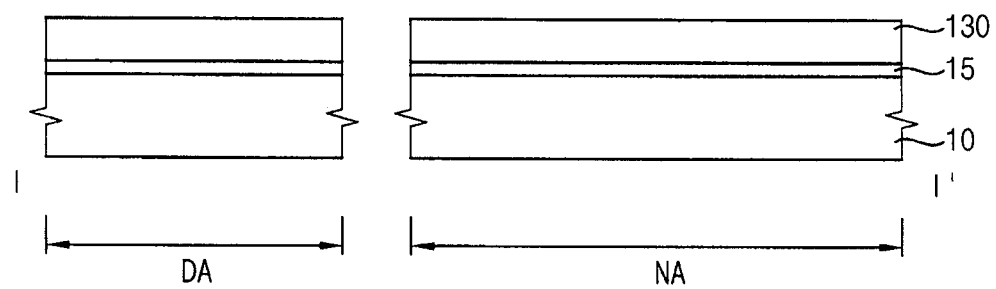
FIGS. 5A through 5G are cross-sectional views illustrating a method of manufacturing a flexible display device according to example embodiments of the present invention.

According to an embodiment illustrated in FIG. 5A, the flexible base substrate 130 is formed on the carrier substrate 10. The flexible base substrate 130 may have the display region DA and the non-display region NA. In some embodiments, a sacrificial layer (e.g., a sacrifice layer) 15 may be further formed between the carrier substrate 10 and the flexible base substrate 130.

The carrier substrate 10 may sustain the flexible base substrate 130 at an area where the carrier substrate 10 is under (or on) the flexible base substrate 130. The flexible base substrate 130 may maintain a shape without deformation by the carrier substrate 10. Thus, when the display unit 150 is formed on the flexible base substrate 130, the deformation of the flexible base substrate 130 can be prevented by the carrier substrate 10. According to an example embodiment, the carrier substrate 10 may include a glass substrate, a quartz substrate, etc.

In some embodiments, the sacrificial layer 15 is located between the carrier substrate 10 and the flexible base substrate 130. By irradiating the laser on the sacrificial layer 15, the flexible base substrate 130 may be separated from the carrier substrate 10. In addition, the sacrificial layer 15 may prevent the flexible base substrate 130 from being damaged by the laser irradiation.

In some embodiments, the flexible base substrate 130 comprises the display region DA and the non-display region NA. The flexible base substrate 130 may also include an insulation material. According to an example embodiment, the flexible base substrate 130 may include a polyimide (PI) to improve a mechanical strength and a heat resistance. Therefore, durability of the flexible display device may be improved by the flexible base substrate 130 including the PI.

Figure 5B:
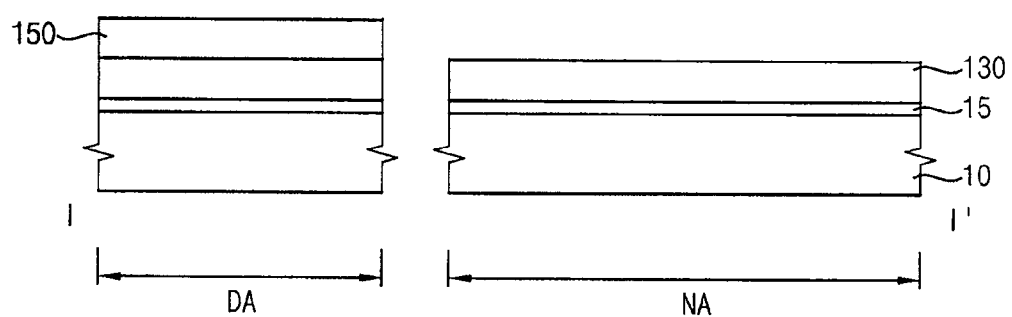

As illustrated in FIG. 5B, the display unit 150 having a plurality of pixels is formed at the display region DA of the flexible base substrate 130. To stably form the display unit 150, the carrier substrate 10 may sustain the flexible base substrate 130, thereby preventing the deformation of the flexible base substrate 130. The pixels included in the display unit 150 may be electrically coupled to the driving circuit 180 formed on the non-display region NA through signal lines. The pixels may display images by receiving data signals from the driving circuit 180. According to an example embodiment, the display unit 150 includes an OLED element. For example, the display unit 150 may correspond to the display unit of FIG. 3.

Figure 5C:
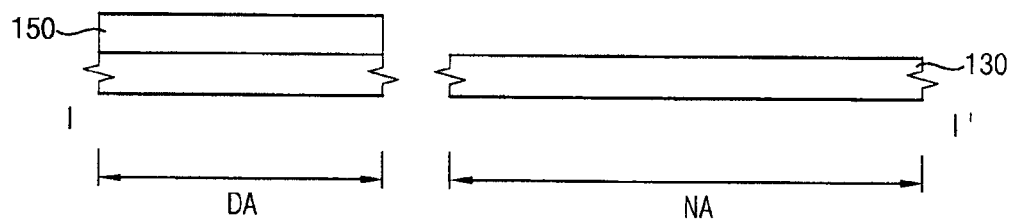

As illustrated in FIG. 5C, the flexible base substrate 130 is separated from the carrier substrate 10. To separate the flexible base substrate 130 from the carrier substrate 10, laser or ultraviolet (UV) irradiation can be used. For example, a gas may be generated from the sacrificial layer 15 due to the laser irradiation, thereby separating the flexible base substrate 130 from the carrier substrate 10.

Figure 5D:
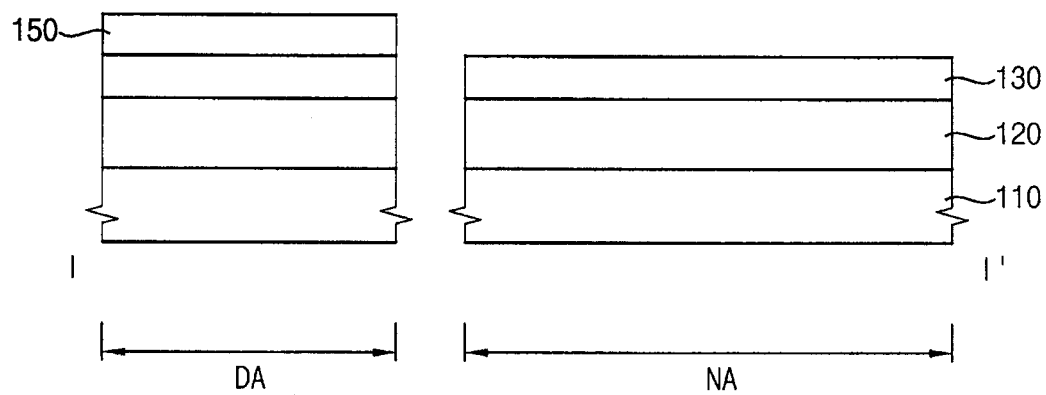

As illustrated in FIG. 5D, the adhesive layer 120 is formed under the flexible base substrate 130 and the flexible carrier film 110 may be formed under the adhesive layer 120.

The flexible carrier film 110 may sustain the flexible base substrate 130 under the flexible base substrate 130, and may include a material that can be bent or curved. According to an example embodiment, the flexible carrier film 110 includes a polyethylene terephthalate (PET).

The adhesive layer 120 is located between the flexible carrier film 110 and the flexible base substrate 130. The flexible base substrate 130 may adhere to the flexible carrier film 110 using the adhesive layer 120. According to an example embodiment, the adhesive layer 120 includes at least one of a rubber-based resin, an acrylic-based resin, a vinyl ester-based resin, a silicon-based resin, and a urethane-based resin.

Figure 5E:
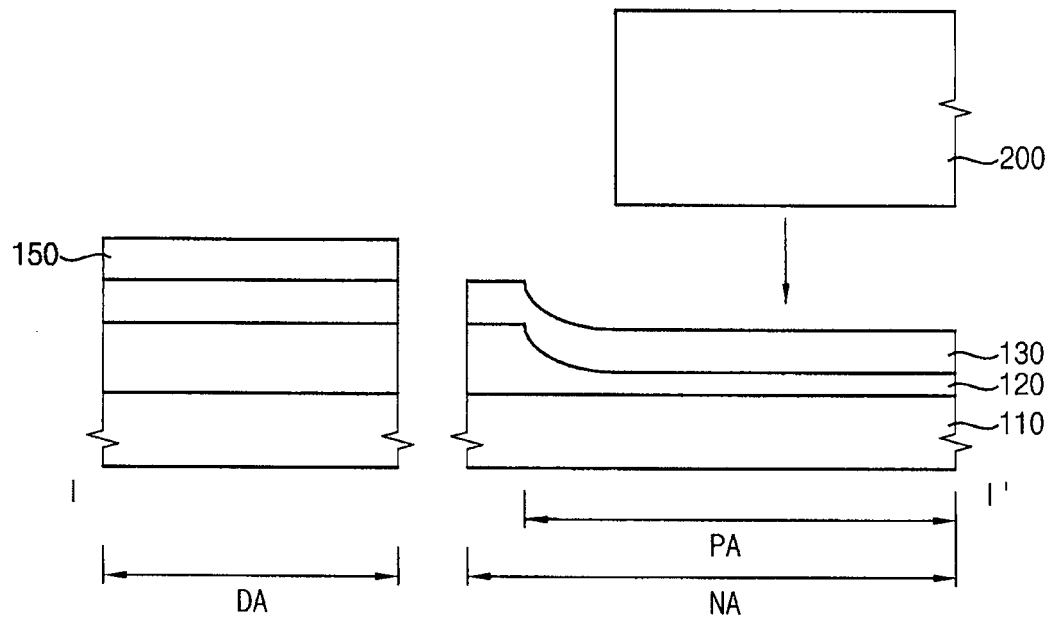

As illustrated in FIG. 5E, the pressed region PA is formed on the adhesive layer 120 by partially pressing, or compressing, the adhesive layer 120. According to an example embodiment, the pressed region PA is formed by pressing the adhesive layer 120 using a pressing tool 200. The pressing tool 200 may press a portion of the non-display region NA that overlaps the adhesive layer 120 to form the pressed region PA. According to an example embodiment, the pressing tool 200 may be heated before pressing the adhesive layer 120.

According to an example embodiment, the pressed region PA has a thickness in a range from about 0.1 µm to about 3 µm. According to an example embodiment, a difference between the height/thickness of the pressed region PA and the height/thickness of the non-pressed region PA is in a range from about 20 µm to about 50 µm. According to an example embodiment, the pressed region PA may have a rectangular shape. According to another example embodiment, the pressed region PA has a rectangular shape with rounded or chamfering corners. The adhesive layer 120 and the pressed region PA of the adhesive layer 120 are described above, and duplicated descriptions will therefore be omitted.

Figure 5F:
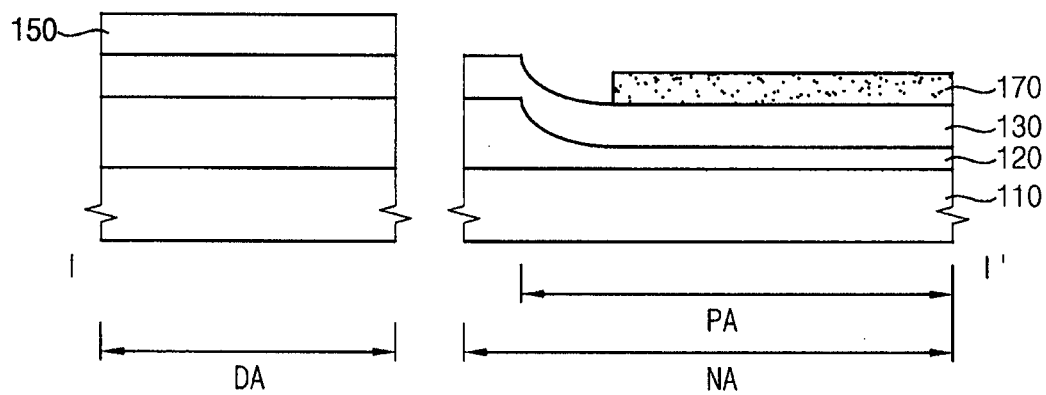

As illustrated in FIG. 5F, the ACF 170 is formed on the flexible base substrate 130 that overlaps the pressed region PA. The ACF 170 may include a conductive particle for electrical coupling and an adhesive resin for physical coupling (see FIG. 4).

Although it is illustrated in FIG. 5F that the ACF 170 is formed on a portion of the flexible base substrate 130 that overlaps the adhesive layer 120 with the pressed region PA being already formed, the pressed region PA may alternatively be formed when the ACF is pressed on the non-display region NA prior to the formation of the pressed region PA. For example, when the ACF is formed, the pressure may be applied to the adhesive layer 120 to form the pressed region PA without additional pressing process.

Figure 5G:
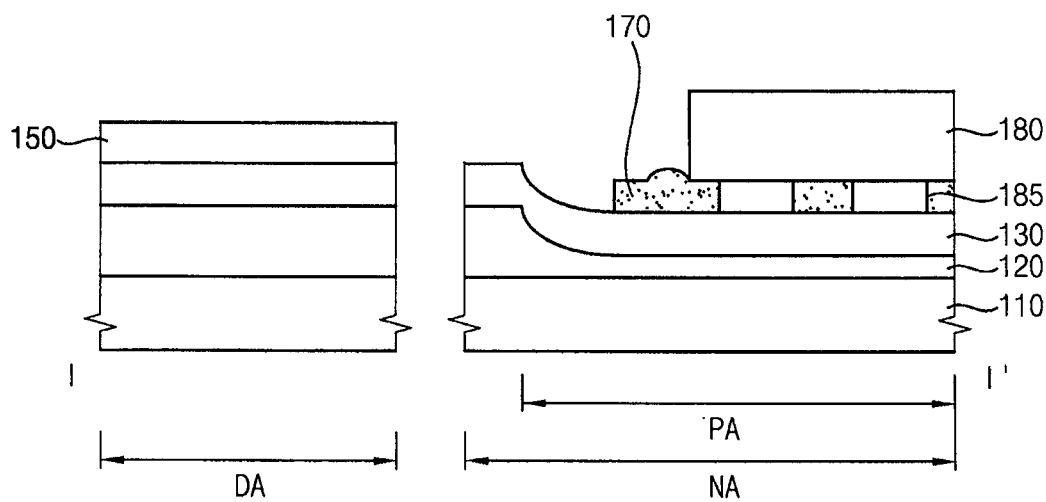

As illustrated in FIG. 5G, the driving circuit 180 is mounted on the flexible base substrate 130 on which the ACF 170 is formed. The driving circuit 180 may be mounted on a portion of the flexible base substrate 130 that overlaps the pressed region PA. Therefore, the driving circuit 180 may be stably mounted by preventing the adhesive layer 120 from being pushed (e.g., by reducing further compression of the adhesive layer in the pressed region PA). The flexible display device may reduce the bonding gap between the flexible base substrate 130 and a bump 185 of the driving circuit 180. The flexible display device does not have a crack at an edge of the bump 185.

Therefore, the flexible display device may prevent a contact failure of the driving circuit 180. Also, the flexible display device may improve a visibility of a pressed mark to check whether the driving circuit 180 is correctly mounted, because the pressed region PA of the adhesive layer 120 has relatively thin thickness and the bonding gap between the flexible base substrate 130 and the bump 185 of the driving circuit 180 is small. In addition, the described method of manufacturing the flexible display device may reduce a size of the flexible display device, and may reduce manufacturing cost of the flexible display device, because the driving circuit 180 of the flexible display device may be mounted by the COP technique that does not need the film used in a chip-on-film (COF) technique.

The described embodiments may be applied to any electronic device having a flexible display device. For example, the described embodiments may be applied to a television, a computer monitor, a laptop, a digital camera, a cellular phone, a smart phone, a smart pad, a personal digital assistant (PDA), a portable multimedia player (PMP), a MP3 player, a navigation system, a game console, a video phone, etc.

The foregoing is illustrative of example embodiments, and is not to be construed as limiting thereof. Although only a few example embodiments have been described, those skilled in the art will readily appreciate that many modifications to the example embodiments are possible without materially departing from the novel teachings and features of the described embodiments. Accordingly, all such modifications are intended to be included within the scope of the present inventive concept as defined by the claims, and their equivalents. Therefore, it is to be understood that the foregoing is illustrative of various example embodiments, and is not to be construed as limited to the specific example embodiments disclosed, and that modifications to the disclosed example embodiments, as well as other example embodiments, are intended to be included within the scope of the appended claims and their equivalents.

What is claimed is:

1. A method for manufacturing a flexible display device, the method comprising:
   forming a flexible base substrate on a carrier substrate, the flexible base substrate having a display region and a non-display region;
   forming a display unit comprising a plurality of pixels at the display region;
   separating the flexible base substrate from the carrier substrate;
   forming an adhesive layer under the flexible base substrate;
   forming a flexible carrier film under the adhesive layer to form an assembly;
   forming a pressed region of the adhesive layer by partially pressing the assembly at a portion of the non-display region of the flexible base substrate; and
   mounting a driving circuit at the portion of the non-display region overlapping the pressed region with a second adhesive layer.

2. The method of claim 1, wherein the pressed region has a thickness in a range of about 0.1 µm to about 3 µm.

3. The method of claim 1, wherein the forming the pressed region comprises pressing the adhesive layer using a pressing tool.

4. The method of claim 3, wherein the pressing the adhesive layer comprises heating the pressing tool before pressing the adhesive layer.

5. The method of claim 1, wherein the pressed region has a rectangular shape.

6. The method of claim 1, wherein the pressed region has a rectangular shape with rounded or chamfering corners.

7. The method of claim 1, wherein the flexible base substrate comprises a polyimide (PI).

8. The method of claim 1, wherein the adhesive layer comprises at least one of a rubber-based resin, an acrylic-based resin, a vinyl ester-based resin, a silicon-based resin, or a urethane-based resin.

9. The method of claim 1, wherein the flexible carrier film comprises a polyethylene terephthalate (PET).

10. The method of claim 1, wherein the mounting the driving circuit comprises using an anisotropic conductive film (ACF) as the second adhesive layer.

11. The method of claim 10, wherein the forming the pressed region further comprises pressing the ACF at the non-display region.

* * * * *